United States Patent
Wang et al.

(10) Patent No.: US 9,419,783 B1
(45) Date of Patent: Aug. 16, 2016

(54) PHASE DETECTING APPARATUS AND PHASE ADJUSTING METHOD

(71) Applicant: VIA Technologies, Inc., New Taipei (TW)

(72) Inventors: Wei-Yu Wang, New Taipei (TW); Cheng-Ming Ying, New Taipei (TW)

(73) Assignee: VIA Technologies, Inc., New Taipei (TW)

( * ) Notice: Subject to any disclaimer, the term of this patent is extended or adjusted under 35 U.S.C. 154(b) by 0 days.

(21) Appl. No.: 14/735,156

(22) Filed: Jun. 10, 2015

(30) Foreign Application Priority Data

Mar. 26, 2015 (TW) .............................. 104109723 A

(51) Int. Cl.
  *H04W 56/00* (2009.01)
  *H04L 7/00* (2006.01)

(52) U.S. Cl.
  CPC ............ *H04L 7/0054* (2013.01); *H04L 7/0016* (2013.01); *H04L 7/0087* (2013.01); *H04W 56/0065* (2013.01)

(58) Field of Classification Search
  CPC ... H04L 7/0054; H04L 7/0087; H04L 7/0016; H04W 56/0035; H03L 7/093
  See application file for complete search history.

(56) References Cited

U.S. PATENT DOCUMENTS

| | | | | |
|---|---|---|---|---|
| 4,137,427 A | * | 1/1979 | Choquet | H04L 7/0054 327/155 |
| 4,475,220 A | * | 10/1984 | Mattei | H04L 7/0054 327/7 |
| 6,150,855 A | * | 11/2000 | Marbot | H03B 19/14 327/116 |
| 6,347,128 B1 | | 2/2002 | Ransijn | |
| 6,636,092 B1 | * | 10/2003 | Stine | H03L 7/091 327/140 |
| 6,977,879 B1 | * | 12/2005 | Hamada | G11B 20/10 369/53.34 |
| 7,579,970 B2 | * | 8/2009 | Seo | H04L 7/0054 341/118 |
| 8,798,217 B2 | * | 8/2014 | Kong | H04L 7/033 324/76.82 |
| 2003/0165208 A1 | * | 9/2003 | Carter | H03L 7/0891 375/373 |
| 2004/0022311 A1 | * | 2/2004 | Zerbe | H04L 25/03038 375/229 |
| 2008/0126010 A1 | * | 5/2008 | Cranford | H04L 1/205 702/180 |
| 2011/0043693 A1 | * | 2/2011 | Nakahira | G09G 5/008 348/512 |
| 2011/0095786 A1 | * | 4/2011 | Yamamoto | G11B 20/10009 327/9 |
| 2012/0063556 A1 | | 3/2012 | Hoang | |
| 2012/0306538 A1 | | 12/2012 | Aryanfar et al. | |
| 2015/0078427 A1 | | 3/2015 | Lin | |

* cited by examiner

*Primary Examiner* — Jean B Corrielus
(74) *Attorney, Agent, or Firm* — Jianq Chyun IP Office

(57) ABSTRACT

A phase detecting apparatus and a phase adjusting method are provided. Determine whether to output a phase adjusting control signal according to a first data sampling value, a second data sampling value and a third data sampling value that are successively generated, so as to adjust a phase of a sampling clock signal used to sample a data signal.

4 Claims, 4 Drawing Sheets

PHASE DETECTING APPARATUS AND PHASE ADJUSTING METHOD

CROSS-REFERENCE TO RELATED APPLICATION

This application claims the priority benefit of Taiwan application serial no. 104109723, filed on Mar. 26, 2015. The entirety of the above-mentioned patent application is hereby incorporated by reference herein and made a part of this specification.

BACKGROUND OF THE INVENTION

1. Field of the Invention

The invention generally relates to an electronic apparatus, and more particularly to, a phase detecting apparatus and a phase adjusting method.

2. Description of Related Art

At a receiving end of high-speed serial data, in order to obtain the data accurately, a clock signal must be used as a basis for sampling the data, and a frequency and a phase of the clock signal must be locked on the received data signal. A traditional receiving end uses a clock data recovery device to provide the said clock signal.

A traditional clock data recovery device uses a voltage control oscillator (VCO) to provide the clock signal, samples the data signal with a phase detector according to the clock signal, and controls the charging and discharging of a charge pump according to a sampling value, so as to control the voltage control oscillator in adjusting the frequency of the clock signal, and thereby enables the clock signal to have a correct phase.

A conventional phase detector may determine whether the phase of the clock signal is being ahead or failing behind according to two adjacent data sampling values and a sampling value ranged between the edges of the two adjacent data sampling values, so as to accordingly control the charging and discharging of the charge pump and to timely adjust the phase of the clock signal. However, with the popularity and advances in communication technology, data transmission bit rate becomes higher and higher and signal attenuation becomes increasingly obvious, the conventional phase adjustment has gradually lost its adjustment precision, and thus a more accurate phase adjustment is in need for preventing circuit instability and circuit performance degradation from being caused due to phase difference.

SUMMARY OF THE INVENTION

The invention is directed to a phase detecting apparatus and a phase adjusting method, which can properly adjust a phase of a sampling clock signal, thereby preventing circuit instability and circuit performance degradation from being caused due to phase difference.

The phase detecting apparatus of the invention includes a comparing unit, a storage unit and a processing unit. The comparing unit receives and samples a data signal to generate a sampling signal, and the sampling signal includes a plurality of data sampling values and a plurality of data edge sampling values that are alternately generated. The comparing unit compares the data sampling values and the data edge sampling values that are adjacent to each other, so as to generate a plurality of comparison values. The storage unit is coupled to the comparing unit, and stores the data sampling values, the data edge sampling values and the comparison values. The processing unit is coupled to the storage unit, and determines whether to output a phase adjusting control signal according to a first data sampling value, a second data sampling value and a third data sampling value that are successively generated, so as to adjust a phase of a sampling clock signal used to sample the data signal.

The phase adjusting method of the invention includes the following steps. A data signal is received and sampled to generate a sampling signal, wherein the sampling signal includes a plurality of data sampling values and a plurality of data edge sampling values that are alternately generated. The data sampling values and the data edge sampling values that are adjacent to each other are compared to generate a plurality of comparison values. The data sampling values, the data edge sampling values and the comparison values are stored. Whether to output a phase adjusting control signal is being determined according to a first data sampling value, a second data sampling value and a third data sampling value that are successively generated, so as to adjust a phase of a sampling clock signal used to sample the data signal.

In view of the above, the invention determines whether to output the phase adjusting control signal according to the first data sampling value, the second data sampling value and the third data sampling value that are successively generated, so as to adjust the phase of the sampling clock signal used to sample the data signal, and to perform a phase adjustment of the sampling clock signal when the circuit is more stable, and thereby may adjust the phase of the sampling clock signal more properly, thus preventing circuit instability and circuit performance degradation from being caused due to phase difference.

In order to make the aforementioned features and advantages of the present invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
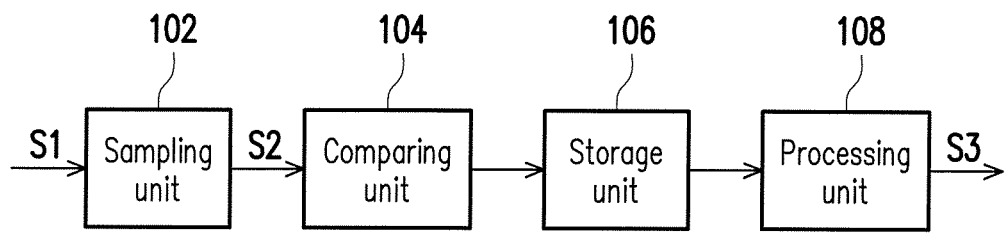
FIG. 1 illustrates a schematic diagram of a phase detecting apparatus according to an embodiment of the invention.
Figure 2:
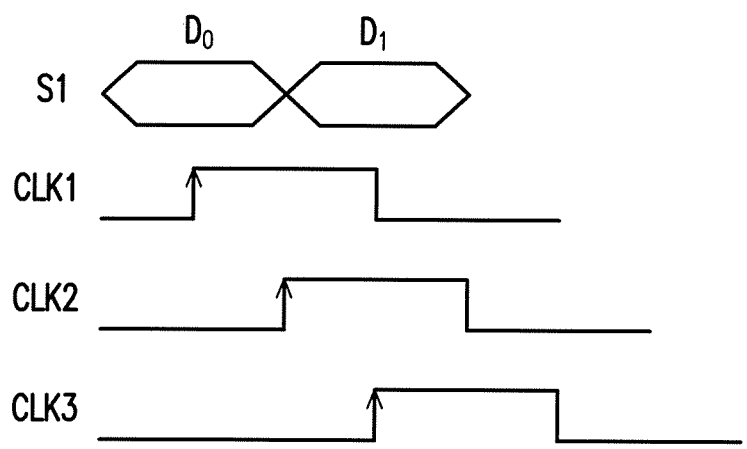
FIG. 2 is a schematic diagram illustrating an oversampling being performed to a data signal.

FIG. 1 illustrates a schematic diagram of a phase detecting apparatus according to an embodiment of the invention. Referring to FIG. 1, the phase detecting apparatus includes a sampling unit 102, a comparing unit 104, a storage unit 106 and a processing unit 108, wherein the comparing unit 104 is coupled to the sampling unit 102 and the storage unit 106, and the storage unit 106 is further coupled to the processing unit 108. The sampling unit 102 may, for example, samples a data signal S1 by means of oversampling, that is, to use a set of sampling clock signals having the same frequency but different phases to respectively perform sampling actions to the data signal S1. FIG. 2 is a schematic diagram illustrating an oversampling being performed to a data signal S1, please refer to FIG. 2. The embodiment of FIG. 2 uses three sampling clock signals CLK1, CLK2 and CLK3 to respectively sample the data signal, so as to generate the sampling signal S2 to the comparing unit 104. The sampling signal may include a plurality of data sampling values and a plurality of data edge sampling values that are alternately generated, as shown in FIG. 2, wherein the data sampling values (namely, $D_0$ and $D_1$) can be obtained by sampling the data signal S1 according to rising edges of the sampling clock signals CLK1 and CLK3, and the data edge sampling values that are ranged between the two data sampling values can be obtained by sampling the data signal S1 according to a rising edge of the sampling clock signal CLK2. By continuously and respectively sampling the data signal S1 according to the sampling clock signals CLK1, CLK2 and CLK3, the data sampling values and the data edge sampling values can alternately be generated. It is to be noted that, in some of the embodiments, the sampling unit 102 can sample the data signal S1 according to a single sampling clock signal, and is not limited to sampling the data signal S1 by means of oversampling.

The comparing unit 104 may, for example, be implemented with a comparator or a logic circuit (e.g., an AND gate, an Exclusive-OR gate . . . etc.), which can two-by-two compares the data sampling values of the sampling unit 102, sequentially, such that every sampling value will be compared with the next sampling value, namely, the data sampling values and the data edge sampling values that are adjacent to each other will be compared, so as to generate a plurality of comparison values. The storage unit 106 stores the data sampling values, the data edge sampling values and the comparison values. In addition, the processing unit 108 can determine whether to output a phase adjusting control signal S3 according to three data sampling values that are successively generated, so as to adjust a phase of the sampling clock signal used by the sampling unit 102 in sampling the data signal S1.

For instance, three data sampling values $D_{-1}$, $D_0$ and $D_1$ are the sampling results successively obtained by the sampling unit 102 after sampling the data signal S1, and Table 1 below shows the conditions when the data sampling values $D_0$ and $D_1$ are different:

TABLE 1

|  | $D_{-1}$ | $D_0$ | $D_1$ |
|---|---|---|---|
| Sampling result A | 0 | 0 | 1 |
| Sampling result B | 1 | 0 | 1 |
| Sampling result C | 0 | 1 | 0 |
| Sampling result D | 1 | 1 | 0 |

The sampling results of the data sampling values $D_{-1}$, $D_0$ and $D_1$ as shown in Table 1 are the sampling results that may appear under the conditions when the data sampling value $D_0$ and data sampling value $D_1$ are different. In the present embodiment, when the data sampling value $D_0$ and the data sampling value $D_1$ are different, the processing unit 108 may determine whether a data sampling value (namely, the data sampling value $D_{-1}$) prior to the data sampling value $D_0$ is the same as the data sampling value $D_0$. When the data sampling value $D_{-1}$ and the data sampling value $D_0$ are the same, the processing unit 108 may determine whether the sampling clock signal used by the sampling unit 102 to sample the data signal S1 is being ahead of or falling behind a phase of the data signal S1 according to the comparison values obtained by the comparing unit 104 when comparing the data sampling value $D_0$, the data sampling values $D_1$ and the data edge sampling values ranged between the data sampling value $D_0$ and the data sampling value D1.

Using the sampling result A for an example, if it is known from a comparison value between a data edge sampling value ranged between the data sampling value $D_0$ and data sampling value $D_1$ and the data sampling value $D_0$ that the data edge sampling value ranged between the data sampling value $D_0$ and the data sampling value $D_1$ is different from the data sampling value $D_0$ (namely, the data edge sampling value=1), then it indicates that the sampling clock signal used by the sampling unit 102 to sample the data signal S1 falls behind the phase of the data signal S1. If it is known from a comparison value between a data edge sampling value ranged between the data sampling value $D_0$ and data sampling value $D_1$ and the data sampling value $D_1$ that the data edge sampling value ranged between the data sampling value $D_0$ and the data sampling value $D_1$ is different from the data sampling values $D_1$ (namely, the data edge sampling values=0), then it indicates that the sampling clock signal used by the sampling unit 102 to sample the data signal S1 is ahead of the phase of the data signal S1. After the processing unit 108 determines that the sampling clock signal is being ahead of or falling behind data signal S1, the processing unit 108 can adjust the phase of the sampling clock signal based on whether the sampling clock signal is being ahead or falling behind, so as to prevent the sampling unit 102 from having a sampling error and causing circuit instability and circuit performance degradation.

Moreover, when the data sampling value $D_0$ and the data sampling value $D_1$ are different, and the processing unit 108 determines a data sampling value (namely, the data sampling value $D_{-1}$) prior to the data sampling value $D_0$ is also different from the data sampling value $D_0$, the processing unit 108 does not adjust the phase of the sampling clock signal. For instance, under the conditions of having the sampling results B and C of Table 1, the processing unit 108 does not adjust the phase of the sampling clock signal.

In addition, the storage unit may, for example, be implemented with a register, which may, for example, be used to temporarily store the comparison values between the data sampling values $D_{-1}$, $D_0$ and $D_1$, the data sampling values $D_{-1}$, $D_0$ and $D_1$ and data edge sampling values.

Under the application of high-speed data transmission (e.g., at a transmission rate higher than 5 GHz), such as in transmission technologies of USB 3.0, USB 3.1, PCIE Gen2, PCIE Gen3 and etc., signal attenuation effects will be more obvious, thereby causing the data signal S1 to encounter a commutation point offset during a state conversion thereof (namely, when switching a logic level thereof); and the higher the frequency when the data signal S1 switches its state, the more severe the offset effect, and thus will greatly affect an accuracy of the phase adjustment of the sampling clock signal. In order to prevent the above condition, the processing unit 108 in the above embodiment determines whether to output the phase adjusting control signal according to the data sampling values $D_{-1}$, $D_0$ and $D_1$ that are successively generated, so as to adjust the phase of the sampling clock signal; and the phase of the sampling clock signal is adjusted according to the data sampling values $D_0$ and $D_1$ only under the condition that the data sampling value $D_{-1}$ being the same as the data sampling value $D_0$, thereby preventing a stability of processing unit 108 in adjusting the phase of the sampling clock signal from being lowered due to frequent state switching of the data signal S1.

In another embodiment, when the data sampling value $D_0$ and the data sampling value $D_1$ are different and the processing unit 108 determines that a data sampling value (namely, the data sampling value $D_{-1}$) prior to the data sampling value $D_0$ is also different from the data sampling values $D_0$, the processing unit 108 adjusts the phase of the sampling clock signal according to a fixed counting interval. For instance, a counter (not shown) is configured within the processing unit 108, and the counter may also be independently configured outside of the processing unit 108, wherein the counter is used to count the amount of the current sampling data. The processing unit 108 adjusts the phase of the sampling clock signal according to a specific count value and a multiple thereof. That is to say, under the condition of having the sampling results B and C of Table 1, the processing unit 108 will consider the aforesaid current count value at the same time, and when the current count value is the specific count value or a multiple thereof, then the processing unit 108 will adjusts the phase of the sampling clock signal; otherwise, the phase of the sampling clock signal will not be adjusted.

Figure 3:
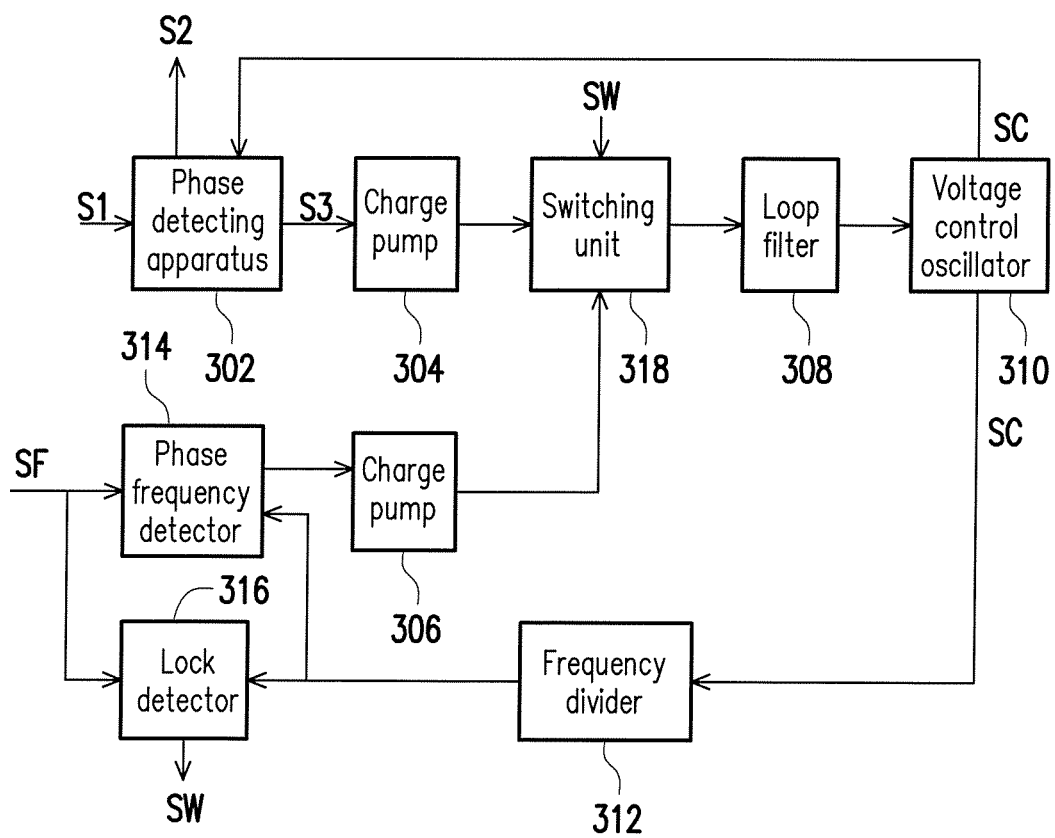
FIG. 3 illustrates a schematic diagram of a clock data recovery unit applied with a phase detecting apparatus according to an embodiment of the invention.

FIG. 3 illustrates a schematic diagram of a clock data recovery unit applied with a phase detecting apparatus according to an embodiment of the invention, please refer to FIG. 3. The phase detecting apparatus in FIG. 1 above may, for example, be applied to a clock data recovery unit. In the present embodiment, the clock data recovery unit includes a phase detecting apparatus 302, a charge pump 304, a charge pump 306, a loop filter 308, a voltage control oscillator 310, a frequency divider 312, a phase frequency detector 314, a lock detector 316 and a switching unit 318, wherein the phase detecting apparatus 302 is coupled to the charge pump 304 and the voltage control oscillator 310, the switching unit 318 is coupled to the charge pump 304, the charge pump 306 and the loop filter 308, the loop filter 308 is coupled to the voltage control oscillator 310, the frequency divider 312 is coupled to the phase frequency detector 314, lock detector 316 and the voltage control oscillator 310, and the phase frequency detector 314 is further couple to the charge pump 306. The charge pump 306, the loop filter 308, the voltage control oscillator 310, the frequency divider 312 and the phase frequency detector 314 may constitute a phase-locked loop, which can locks on a clock signal SC outputted from the voltage control oscillator 310 according to a reference frequency signal SF. When the lock detector 316 detects that a result of frequency dividing the clock signal SC, in which a phase and a frequency of the clock signal SC and a phase and a frequency of the reference frequency signal SF are all fall within a tolerable range and thereby reach a stable state (namely, locked), the lock detector 316 may output a switching control signal SW to the switching unit 318, so as to switch the loop filter 308 into a connection with the charge pump 304, and thereby enables a loop constituted by the phase detecting apparatus 302, the charge pump 304, the loop filter 308 and the voltage control oscillator 310 to start operating.

Similar to the phase detecting apparatus of the previous embodiment, a processing unit (not shown) in the phase detecting apparatus 302 of the present embodiment may determine whether to output a phase adjusting control signal S3 according to three data sampling values $D_{-1}$, $D_0$ and $D_1$ that are successively generated, so as to adjust a phase of the clock signal SC outputted from the voltage control oscillator 310. In the present embodiment, the clock signal SC is the basis for the sampling unit in the phase detecting apparatus 302 to sample the data signal S1, and the phase adjusting control signal S3 may be a pull-up control signal or a pull-down control signal. Only under the condition that the data sampling value $D_0$ and the data sampling value $D_1$ are not the same and the data sampling value $D_{-1}$ and the data sampling values $D_0$ are the same, the processing unit in the phase detecting apparatus 302 will determine whether the phase of the clock signal SC is being ahead or falling behind according to the data sampling values $D_0$ and $D_1$ and the data edge sampling values, and output the phase adjusting control signal S3, so as to control the charge pump 304 to perform a charging and a discharging, for adjusting the phase of the clock signal SC. As such, a stability of processing unit in adjusting the phase of the clock signal SC may be prevented from being lowered due to frequent state switching of the data signal S1, and thereby capable of accurately sampling a sampling signal S2 of the data. Under the condition that the data sampling value $D_0$ and the data sampling value $D_1$ are different and the data sampling value $D_{-1}$ and the data sampling value $D_0$ are different, the processing unit in the phase detecting apparatus 302 does not output the phase adjusting control signal S3. In another embodiment, under the condition that the data sampling value $D_0$ and the data sampling value $D_1$ are different and the data sampling value $D_{-1}$ and the data sampling value $D_0$ are different, the processing unit in the phase detecting apparatus 302 adjusts the phase of the sampling clock signal according to a fixed counting interval. The processing unit 108 refers to a current count value of a counter and adjusts the phase of the sampling clock signal according to a specific count value and a multiple thereof; otherwise, the phase of the sampling clock signal is not adjusted.

It is to be noted that, the phase detecting apparatus of the above embodiment is not limited to be applied only in the clock data recovery unit, and it can also be applied in any circuit which requires to perform a phase detection, such as in a phase-locked loop circuit.

Figure 4:
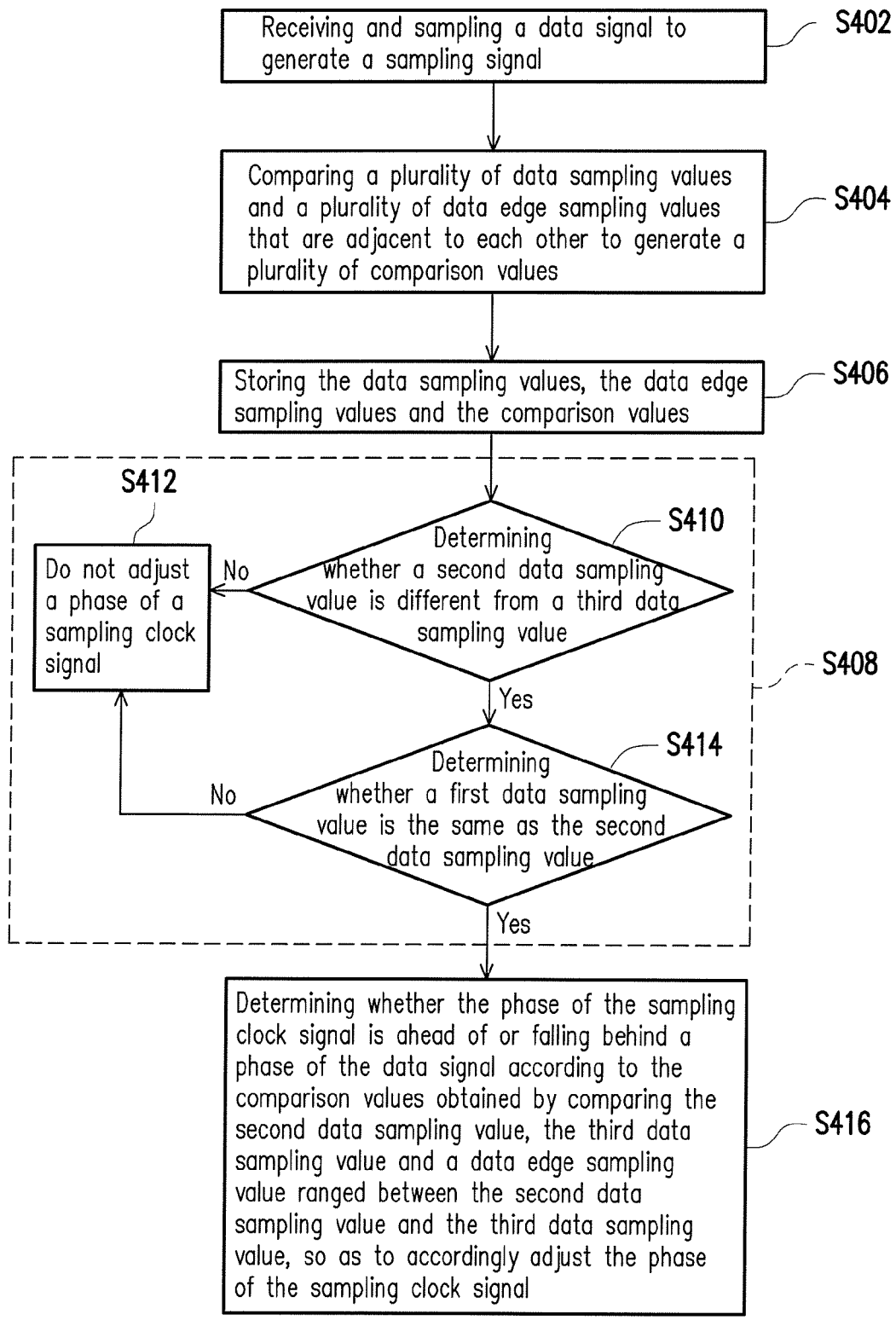
FIG. 4 illustrates a schematic flow chart of a phase adjusting method according to an embodiment of the invention.

FIG. 4 illustrates a schematic flow chart of a phase adjusting method according to an embodiment of the invention, please refer to FIG. 4. It can be known from the phase detecting apparatus in the above embodiment that the phase adjusting method of the phase detecting apparatus can include the following steps. First, a data signal is received and sampled to generate a sampling signal (step S402), wherein the sampling signal includes a plurality of data sampling values and a plurality of data edge sampling values that are alternately generated. Next, the data sampling values and the data edge sampling values that are adjacent to each other are compared, so as to generate a plurality of comparison values (step S404). Then, the data sampling values, the data edge sampling values and the comparison values are stored (step S406). Afterwards, whether to output a phase adjusting control signal is being determined according to a first data sampling value, a second data sampling value and third data sampling value that are successively generated, so as to adjust a phase of a sampling clock signal used to sample the data signal (step S408). In detail, the step S408 may include: firstly determining whether the second data sampling value is different from the third data sampling value (step S410), and if the second data sampling value is the same as the third data sampling value, then do not adjust the phase of the sampling clock signal (step S412). If the second data sampling value is different from the third data sampling value, then determines whether the first data sampling value is the same as the second data sampling value (step S414), and if the first data sampling value is different from the second data sampling value, then enters into step S412, and do not adjust the phase of the sampling clock signal. Contrarily, if the first data sampling value is the same as the second data sampling value, then determine whether the phase of the sampling clock signal is ahead of or falling behind the phase of the data signal according to the comparison values obtained by comparing the second data sampling value, the third data sampling value and a data edge sampling value ranged between the second data sampling value and the third data sampling value, so as to accordingly adjust the phase of the sampling clock signal (step S416).

Figure 5:
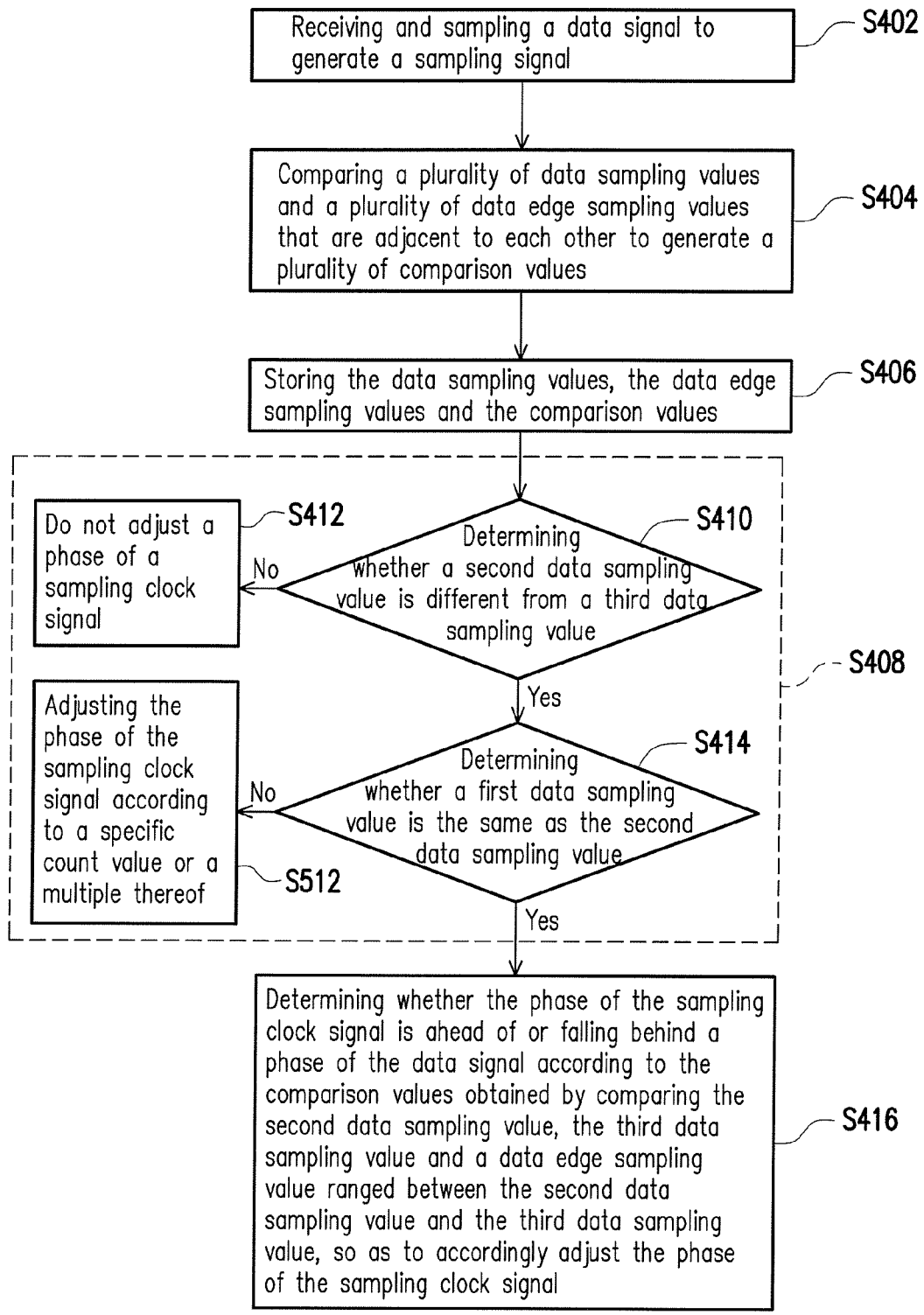
FIG. 5 illustrates a schematic flow chart of a phase adjusting method according to another embodiment of the invention.

FIG. 5 illustrates a schematic flow chart of a phase adjusting method according to another embodiment of the invention, please refer to FIG. 5. FIG. 5 is similar to FIG. 4, and a merely difference lies in that FIG. 5 further includes a step S512. That is, in the present embodiment, when it is determined that the second data sampling value is different from the third data sampling value and the first data sampling value is different from the second data sampling value, it enters into the step S512, the phase of the sampling clock signal is adjusted according to a specific count value or a multiple thereof; taking a current count value of the counter for an example, when the current count value is the specific count value or a multiple thereof, the phase of the sampling clock signal is adjusted.

In summary, the invention determines whether to output the phase adjusting control signal according to the first data sampling value, the second data sampling value and the third data sampling value that are successively generated, so as to adjust the phase of the sampling clock signal used to sample the data signal, and to perform a phase adjustment of the sampling clock signal when the circuit is more stable, and thereby may adjust the phase of the sampling clock signal more properly, thus preventing circuit instability and circuit performance degradation from being caused due to phase difference.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A phase adjusting method, comprising:
receiving and sampling a data signal to generate a sampling signal, the sampling signal comprising a plurality of data sampling values and a plurality of data edge sampling values that are alternately generated;
comparing the data sampling values and the data edge sampling values that are adjacent to each other, so as to generate a plurality of comparison values;
storing the data sampling values, the data edge sampling values and the comparison values; and
determining whether to output a phase adjusting control signal according to a first data sampling value, a second data sampling value and a third data sampling value that are successively generated, so as to adjust a phase of a sampling clock signal used to sample the data signal,
wherein when the second data sampling value is different from the third data sampling value and the first data sampling value is the same as the second data sampling value, the phase of the sampling clock signal is adjusted.

2. A phase adjusting method, comprising:
receiving and sampling a data signal to generate a sampling signal, the sampling signal comprising a plurality of data sampling values and a plurality of data edge sampling values that are alternately generated;
comparing the data sampling values and the data edge sampling values that are adjacent to each other, so as to generate a plurality of comparison values;
storing the data sampling values, the data edge sampling values and the comparison values; and
determining whether to output a phase adjusting control signal according to a first data sampling value, a second data sampling value and a third data sampling value that are successively generated, so as to adjust a phase of a sampling clock signal used to sample the data signal,
wherein when the second data sampling value is different from the third data sampling value and the first data sampling value is different from the second data sampling value, the phase of the sampling clock signal is not adjusted.

3. A phase adjusting method, comprising:
receiving and sampling a data signal to generate a sampling signal, the sampling signal comprising a plurality of data sampling values and a plurality of data edge sampling values that are alternately generated;
comparing the data sampling values and the data edge sampling values that are adjacent to each other, so as to generate a plurality of comparison values;
storing the data sampling values, the data edge sampling values and the comparison values;
determining whether to output a phase adjusting control signal according to a first data sampling value, a second data sampling value and a third data sampling value that are successively generated, so as to adjust a phase of a sampling clock signal used to sample the data signal; and
when the second data sampling value is different from the third data sampling value and the first data sampling value is different from the second data sampling value, adjusting the phase of the sampling clock signal according to a fixed counting interval.

4. The phase adjusting method as recited in claim 3, further comprising:
when the second data sampling value is different from the third data sampling value and the first data sampling value is different from the second data sampling value, referring to a current count value of a counter, adjusting the phase of the sampling clock signal when the current count value is a specific count value or a multiple thereof.

* * * * *